US007885418B1

(12) United States Patent
Hallman

(10) Patent No.: US 7,885,418 B1
(45) Date of Patent: Feb. 8, 2011

(54) ACOUSTIC ACTUATOR AND PASSIVE ATTENUATOR INCORPORATING A LIGHTWEIGHT ACOUSTIC DIAPHRAGM WITH AN ULTRA LOW RESONANT FREQUENCY COUPLED WITH A SHALLOW ENCLOSURE OF SMALL VOLUME

(75) Inventor: William Brian Hallman, 8413 Hirsch Dr., Charlotte, NC (US) 28277

(73) Assignee: William Brian Hallman, Charlotte, NC (US)

( * ) Notice: Subject to any disclaimer, the term of this patent is extended or adjusted under 35 U.S.C. 154(b) by 1021 days.

(21) Appl. No.: 11/623,826

(22) Filed: Jan. 17, 2007

(51) Int. Cl.
*G10K 11/16* (2006.01)
*H03B 29/00* (2006.01)
*H04R 1/02* (2006.01)
*H04R 1/20* (2006.01)
*A47B 81/06* (2006.01)

(52) U.S. Cl. ...................... 381/71.7; 381/347; 381/353; 181/199

(58) Field of Classification Search ................ 381/71.7, 381/335, 96, 345, 347, 351, 353, 354, 162, 381/405, 423, 433, 430; 181/145, 171, 198, 181/199, 272, 287; 367/174
See application file for complete search history.

(56) References Cited

U.S. PATENT DOCUMENTS

| | | | | |
|---|---|---|---|---|
| 4,064,375 | A * | 12/1977 | Russell et al. | 381/345 |
| 5,060,274 | A * | 10/1991 | Asami et al. | 381/166 |
| 6,195,442 | B1 * | 2/2001 | Griffin et al. | 381/353 |
| 6,736,425 | B2 * | 5/2004 | Lemon et al. | 280/739 |
| 2004/0136560 | A1 * | 7/2004 | Walsh | 381/401 |

* cited by examiner

*Primary Examiner*—Curtis Kuntz
*Assistant Examiner*—Jesse A Elbin

(57) ABSTRACT

Disclosed is a loudspeaker assembly incorporating innovations resulting in an enclosure of very small volume to which is integrated a large area, shallow and lightweight acoustic diaphragm assembly capable of a natural resonant frequency of a few Hertz. This is achieved by incorporating a vacuum chamber in conjunction with a chamber containing compressed gas or vapor that acts against a movable pressure boundary of changeable area being mechanically coupled with the acoustic radiating diaphragm. In an alternative operating mode, the apparatus also serves as a passive low frequency acoustic attenuator.

14 Claims, 10 Drawing Sheets

ACOUSTIC ACTUATOR AND PASSIVE ATTENUATOR INCORPORATING A LIGHTWEIGHT ACOUSTIC DIAPHRAGM WITH AN ULTRA LOW RESONANT FREQUENCY COUPLED WITH A SHALLOW ENCLOSURE OF SMALL VOLUME

TECHNICAL FIELD AND INDUSTRIAL APPLICABILITY OF THE INVENTION

The present invention relates to the field of loudspeakers and loudspeaker transducers for converting electromagnetic signals to sound but it also relates to the field of acoustic attenuators. The invention pertains specifically to an apparatus for achieving very low resonant frequencies of large area, lightweight acoustic diaphragms coupled with shallow enclosures of small volume.

BACKGROUND OF THE INVENTION

It has long been recognized that the ability of a given loudspeaker transducer to efficiently reproduce low frequency sound in a typical listening space is largely a function of its enclosure size. The fundamental constraints regarding low frequency loudspeaker output were, in due course, correlated in general terms by the so-called Hoffman's Iron Law. First articulated in the 1960's, Hoffman's Iron Law correlates the low frequency output of a loudspeaker with certain physical parameters. These correlations were later expanded and refined by the engineers Thiele and Small whose work now serves as the preeminent mathematical modeling tool for the design of nearly all low frequency loudspeakers. Generally valid even today, Hoffman's Iron Law states that a speaker's acoustical efficiency is directly proportional to its enclosure volume and also the cube of its cutoff frequency. So, to decrease the lower cutoff frequency of a given loudspeaker by a factor of two, e.g. from 40 Hz to 20 Hz, while holding efficiency constant, an increase of enclosure volume must be made on the order of $2^3=8$ times. And if it is desired to reproduce a 20 Hz signal without increasing enclosure volume, the loudspeaker requires 8 times more power to generate the same sound pressure level for a given motor efficiency. Forcing an acoustic transducer to operate incrementally below its natural resonant frequency requires exponentially more power. Generating significant low frequency sound from a small enclosure not only requires powerful amplifiers, but loudspeaker transducers that can effectively direct the large amount of resulting heat away from their voice-coils.

The vast majority of available high-power audio amplifiers, needed to drive presently offered compact subwoofers to sufficient sound pressure levels, utilize complicated circuit topographies with multiple gain stages. Such complex circuits require feedback loops to correct for their poor linearity. Amplifiers of this type are not generally favored by the high-end audio community. Very high-end vacuum-tube and solid state amplifiers, configured to operate in single-ended mode (a form of Class A operation) with little or no feedback, generate relatively small amounts of electrical power. Minimalist amplifiers of this sort are wholly incapable of driving to adequate listening levels currently available compact loudspeakers that are capable of very low frequency sound reproduction. Very large enclosures to are required to achieve reasonable sound pressure levels at very low frequencies with such amplifiers. When amplifier design limits power to just a few watts per channel (e.g. output-transformerless (OTL), single-ended designs utilizing triode vacuum tubes (SET)), very high efficiency bass horns are employed, which are not only enormous for a given low cutoff frequency, but very complicated, heavy, and expensive to manufacture and not without significant sonic shortcomings.

Subwoofers with small enclosure volumes are typically fitted with drivers with correspondingly small diaphragm areas. To help compensate for small surface areas, manufacturers have designed such transducers with very long stroke capabilities. However, because of their long stroke requirement, these drivers typically utilize motors incorporating over-hung voice-coils (i.e., the voice-coil height exceeds the height of its magnetic gap) to limit fabrication costs. This arrangement, however, leads to elevated levels of distortion and, due to the high induction of tall voice-coils, acoustical bandwidth is reduced and a time lag of the current passing through the voice coil occurs; compromising the driver's phase relationship with respect to sound being reproduced by other drivers in a system. The fabrication of a magnetic circuit with a gap height that sufficiently exceeds the height of the coil to accommodate the long excursions required, while achieving a high flux density, is prohibitively expensive.

The acoustical wave propagation impedance of a speaker cone of a given surface area is an inverse function of frequency squared. As such, a small area transducer with a long stroke does not impart an equivalent amount of low frequency acoustical energy into an ordinary listening space as a large area, short stroke driver with equivalent air displacements. Very large area acoustic diaphragms are, therefore, highly advantageous for low frequency performance; requiring a much shorter stroke for a given sound pressure level. A good wave propagation impedance match is particularly important for attenuators incorporating acoustic diaphragms which move passively. When coupled with a shallow, small volume enclosure of conventional design, however, the resonant frequency of a large area, lightweight acoustic diaphragm is very high; inhibiting low frequency performance. This is due to the comparatively large internal pressure change that occurs within such an enclosure for a given amount of acoustic diaphragm stroke.

Most low frequency loudspeakers utilize acoustic diaphragms that are moderately heavy and structurally rigid for the purpose of imparting pressure pulsations to air while undergoing relatively little physical deformation. While various shapes can be used, a conical structure is the most common with the cone driven from its apex via an attached voice-coil that is suspended within a cylindrical, annular gap of high magnetic flux. To achieve efficient operation, the magnetic strength of the motor assembly should be maximized, the voice-coil gap minimized, and the mass of the oscillating parts of the transducer minimized. Unless sophisticated construction techniques are utilized or exotic materials employed, however, thin-walled and lightweight acoustic diaphragms are usually too flexible, resulting in distortion and an uneven frequency response. Furthermore, over-damping of the excursions of large area and very lightweight acoustic diaphragms is difficult to prevent when coupled with large volume enclosures, limiting low frequency performance.

The fundamental purpose of a conventional loudspeaker enclosure is to prevent back waves, radiating from the rear of the acoustic diaphragm, from interacting adversely with the front waves. Speaker drivers coupled with conventional enclosures radiate as much energy into the enclosure as into the listening environment. Much of the energy directed into the enclosure, however, reappears in the listening space via the acoustic diaphragm which is ordinarily a poor sound barrier. This effect is most prevalent at low and middle frequencies where internal stuffing materials are less effective at absorbing sound. These two wave-fronts result in acoustic nulls and smeared transients when they interact in this manner. Although desirable for maximizing efficiency, thin-walled and lightweight acoustic diaphragms are highly susceptible to this problem.

By sufficiently delaying the low frequency back wave to be in phase, at steady-state conditions, with the front wave, some enclosure designs reinforce acoustical output at frequencies below resonance of the driver. Although low frequency efficiency is improved, this approach intrinsically results in poor impulse performance and significant acoustical phase shifts between the tuning frequency and other frequencies, degrading sound fidelity. Despite these shortcomings, a number of enclosure designs have been devised using variations of this approach, in order to maximize low frequency response for a given enclosure size. The more common examples include ported, passive radiator, band-pass, and transmission line designs.

Another type, the isobaric enclosure, is constructed of two (usually) identical drivers mounted to a relatively small sub-enclosure and wired in phase with the drivers mounted front-to-back in series. The back side of the rear driver sees the main enclosure volume, but the back side of the front driver sees the air volume of the sub-chamber between the two drivers. Being wired in phase, the pressure variations in the air space between the drivers is minimized thereby lowering the resonant frequency of the front driver. The front of the front driver faces the listening space. Isobaric loudspeakers are not very efficient, but the enclosure for a given low frequency cutoff point is fairly compact.

Operationally, the acoustic suspension enclosure is the simplest type; being comprised of a driver coupled with an enclosure of desired volume with air sealed within. This enclosure type is specifically designed to absorb the back wave, although in practice significant low and middle frequency sound passes back out through the speaker's acoustic diaphragm and into the listening space; interfering with the front wave and thus degrading sound fidelity. Since the back waves from the driver are deliberately absorbed, the acoustic suspension enclosure is not very efficient compared to some other enclosure types. The resonant frequency of the driver in this enclosure is always higher than its free-air resonant frequency because the enclosed air acts as a pneumatic spring coupled with it. One variation of the acoustic suspension speaker, referred to as an infinite baffle, utilizes an enclosure volume that is so large that the driver behaves nearly as it would if suspended in an unenclosed free-air space. However, if the acoustic diaphragm is particularly lightweight, its excursions are over-damped in this configuration, hindering low frequency output.

The driver in a typical acoustic suspension arrangement uses the volume of air contained within its enclosure to act as a spring coupled with the acoustic diaphragm. For a given excursion of the acoustic diaphragm, the pressure change within the enclosure can be reduced by increasing its volume. A large enclosure volume thus mimics a weak spring giving the acoustic diaphragm a low in situ resonant frequency. Ideally, the resonant frequency of the woofer is below the lower frequency limit of human hearing, i.e. approximately 20 Hz, or even lower if visceral sounds, such as earthquakes, thunder, helicopters, etc., are to be reproduced. Such a low resonant frequency with a typical acoustic suspension arrangement can be achieved with either a heavy acoustic diaphragm coupled with a small enclosure or a lightweight diaphragm coupled with a large enclosure. Heavy acoustic diaphragms hurt efficiency and an enclosure providing for a very low resonant frequency of a driver of normal mass must be very large. The typical enclosure volume required for an acoustic suspension design incorporating an ordinary 15 inch driver of normal mass operating flat to 20 Hz is approximately 7 $ft^3$. Such a large enclosure is prone to sympathetic low frequency resonances within its structure which are audible and thus problematic for accurate sound reproduction. The walls of large enclosures must ordinarily be braced or otherwise increased in thickness to inhibit such resonances.

Compared to designs that use the back waves of the driver to augment the output of the front waves, the phase shift between the lower and upper frequencies is not as severe with acoustic suspension loudspeakers, but it is significant nonetheless. Low frequency drivers operating in typical acoustic suspension enclosures nearly always have resonant frequencies in the audible range, i.e., 20 Hz or above. Proximate their resonant frequency points, sounds emitted by low frequency drivers experience a large phase shift. To preserve phase coherency, some manufacturers operate their low frequency drivers below resonance. But since acoustic output from a driver diminishes rapidly below resonance, significant amplifier compensation is required. This design approach, therefore, requires a very powerful amplifier for strong low frequency performance. Compared to designs that use the back waves of the driver to augment the output of the front waves, the phase shift between the lower and upper frequencies is not as severe A very recent innovation described in U.S. Pat. No. 7,068,806 utilizes chambers of varied pressures acting on differing surface areas to reduce the resonant frequency of the acoustic diaphragm of a low frequency loudspeaker. This design preserves the performance advantages of a standard acoustic suspension speaker and can achieve a low resonant frequency of its acoustic diaphragm. But it must use very high pressures acting on a very small surface area to achieve this with a compact enclosure. Although the enclosure size is greatly reduced for a given resonant frequency, there is still a correlation between enclosure volume and resonant frequency.

The motor assembly of a speaker transducer, which is responsible for converting electrical energy to acoustical energy, must be designed to dissipate heat from its voice-coil. Many speakers employ ferrofluids to limit voice-coil temperature during operation. Ferrofluid is a thermally conductive ferritic liquid used to fill the magnetic gap within which the voice-coil is suspended; conducting heat away from the voice-coil. Ferrofluid is retained in the gap by the magnetic flux, but its retention is difficult in drivers with large excursion capabilities. Furthermore, the viscosity of ferrofluid is prone to change over time, especially in severe service applications, which changes the operating characteristics of the driver. Woofers that do not use ferrofluids must ordinarily incorporate a ventilation system into the motor assembly for sustained operation at high sound pressure levels. Either way, the heat liberated from the motor assembly is ordinarily trapped within acoustic suspension enclosures since, by design, they are airtight. Furthermore, internal enclosure stuffing, needed to absorb the internal sound waves, greatly inhibits heat transfer from the enclosure.

In the field of sound attenuation, acoustic blankets and active feedback motion control attenuators are the common means of dissipating or canceling undesirable very low frequency acoustic energy that may exist in confined spaces. Active devices have the disadvantages of being bulky, heavy and requiring an amplifier and servo control circuitry. Acoustic blankets are heavy and not particularly effective at attenuating the very lowest frequencies. Currently existing passively moving acoustic diaphragm attenuators are also heavy and bulky and have limited attenuation effectiveness and operate over a narrow bandwidth. The need for effective, lightweight and very low frequency attenuators is particularly acute within launch vehicle shrouds where sensitive electronics and structurally fragile payloads are exposed to extremely intense sound pressure levels; much of it at infrasonic frequencies. When the aforementioned conventional means of sound mitigation are not used, an increase in the robustness of the payload structures must be made. Each of these solutions, however, increases launch weight; resulting in reduced payload capacity.

SUMMARY OF THE INVENTION

The principle of operation of the enclosure/acoustic diaphragm assembly of this innovation is obliquely related to the acoustic suspension enclosure principle, but fundamentally reconfigured to vastly reduce its size and volume for a given resonant frequency of the acoustic diaphragm assembly. The invention described herein effectively overcomes each of the aforementioned deficiencies and limitations characteristic of the prior art.

Operation of the invention requires that the space behind the acoustic radiating diaphragm assembly be substantially evacuated of gas; air or otherwise. Negligible enclosed gas is present, therefore, to couple with the acoustic diaphragm assembly, which would otherwise elevate its resonant frequency. Atmospheric pressure does, however, act on the outside surface of the acoustic diaphragm assembly. The large resulting force is counteracted by a mechanical couple in the form of a thin-walled, cylindrical, voice-coil former, the top of which acts against the inside surface of the acoustic diaphragm assembly; in opposition to the force of atmosphere. The lower edge of the cylindrical former is positioned concentrically into the open end of a fixed cylinder which is sealed with a movable high pressure boundary of minimal surface area and charged with compressed gas or vapor. The degree of compression is inversely related to the surface area of the movable high pressure boundary at rest. The movable high pressure boundary is comprised of high tensile strength, gas impermeable, thin and flexible material. The former is pressed against but moves with the movable high pressure boundary (hereafter referred to as the tandem seal) during operation. The inner area of the tandem seal is concentric to its outer portion. The upper inside surface of the pressurized cylinder serves as a fixed support surface for the outer part of the tandem seal. An axially mounted spool piece within the pressurized cylinder provides a fixed support surface for the inner part of the tandem seal. Between these two support surfaces, and fixed to the tandem seal, is the former. The meniscuses of the inner and outer portions of the tandem seal move along these fixed support surfaces and also along the former. The bottom portion of the former, along with the tandem seal, moves within the top portion of the high pressure cylinder. This movement occurs with minimum frictional resistance and with maximum leak tightness. Except for its lower and upper edges, which are attached to the tandem seal and acoustic diaphragm respectively, the external and internal surface areas of the former are exposed to the vacuum that exists behind the acoustic diaphragm assembly. A high pressure chamber or vessel (hereafter referred to as the balance chamber) is connected to, and so pressurizes, the cylinder via transfer ports. Therefore, as the former and the attached tandem seal move in and out, the compressed gas or vapor within the combined volumes of the cylinder, transfer ports and high pressure chamber experience pressure fluctuations. In this arrangement, the movement of the large area acoustic diaphragm assembly ultimately acts only on the small (relative to the acoustic diaphragm) surface area of the tandem seal, which is oppositely acted upon by the force of compressed internal gas or vapor. Because the surface area of the tandem seal is relatively small, its internal pressure is relatively high to counteract, via the former, the atmospheric pressure acting on the relatively large surface area of the acoustic diaphragm assembly. The two counteracting forces are brought into balance by establishing sufficient pressure in the combined high pressure gas or vapor volumes. So balanced, the voice-coil is centered within the magnetic gap of the motor and directs the movement of the acoustic diaphragm assembly, the former, and the tandem seal.

Unlike the concept presented in U.S. Pat. No. 7,068,806, this invention decouples the correlation between the high pressure chamber (or vessel) volume and the resonant frequency of the acoustic radiating diaphragm. This is achieved by the reduction of the working surface area of the tandem seal as the former moves in and an increase of this working surface area as it moves out. Inward movement of the former compresses the enclosed gas or vapor, increasing its pressure. The resulting counter-force is a function of the balance chamber pressure and also the working surface area of the tandem seal. As pressure is increased because of the inward movement, the surface area upon which the gas or vapor acts to counter continued inward movement diminishes, thus reducing the rate (to zero if desired) at which the force increases against it. Conversely, an outward movement of the former decompresses the enclosed gas or vapor, reducing its pressure. As pressure drops because of the outward movement, the surface area on which the gas or vapor acts to facilitate continued outward movement increases, reducing (to zero if desired) the rate at which the facilitating force diminishes. As previously described, the upper inside surface of the pressure cylinder serves as a fixed support surface for the outer part of the tandem seal assembly with an axially mounted spool piece, centered within the cylinder, acting as the fixed support surface of the inner part of the tandem seal. Rather than being parallel to each other in the direction of former travel, the inner and outer fixed support surfaces are curved or tapered to provide the desired force-vs.-position function to achieve a target resonant frequency and/or desired acoustic diaphragm operating behavior. As the meniscuses of the inner and outer parts of the tandem seal move along these fixed support surfaces their radii of curvatures vary as a function of former offset. With an outward movement of the meniscuses, their radii of curvatures increase as the fixed support surfaces diverge from each other in the direction of travel, thus increasing their working surface areas as pressure falls. Conversely, with an inward movement of the meniscuses, their radii of curvatures diminish as the fixed support surfaces converge towards each other in the direction of travel, thus decreasing their working surface areas as pressure increases. The subject invention can theoretically achieve a resonant frequency of <1 Hertz of a large area and lightweight acoustic diaphragm coupled with a shallow enclosure without resorting to extremely high gas or vapor pressures. Such a low resonant frequency, being infrasonic, ensures phase coherency in the audible frequency range, i.e., approximately 20 Hertz and above.

For packaging efficiency, the pressurized balance chamber serves as a structural support for a frame onto which the acoustic diaphragm assembly is mounted thus making it integral to the loudspeaker unit. No additional enclosure, in the conventional sense, is needed for operation. The acoustic diaphragm assembly is attached and sealed around its perimeter to the frame where zero displacement occurs, but freely moves from its center where maximum displacement occurs proximate the former; moving not unlike a human eardrum.

The acoustic diaphragm, however, does not stretch to accommodate this movement, but rather undergoes an increase in the radius of curvature of its concavity.

The pressure of atmosphere (14.7 psia) is sustained by the pressure boundary of the acoustic diaphragm assembly of the subject apparatus, as the space behind it is substantially evacuated of gas or vapor. Large differential pressures acting across typical cone-shaped and rigid acoustic diaphragms result in significant forces of deformation and buckling. Rather than relying on materials with high resistance to bending, and fabricated to specific geometries to impart stiffness, this invention utilizes the pressure differential (up to 14.7 psid) across the acoustic diaphragm assembly to impart a high operational stiffness to what would ordinarily be flexible material. The acoustic diaphragm assembly surface is inwardly inflated by atmospheric pressure and so, being forced into a concave, semi-toroidal shape and being in tension at all times during operation, it does not require conventional structural means to achieve operational stiffness. In accordance with La Place's Law of hoop stress, the forces acting across the face of the acoustic diaphragm assembly will self-minimize by taking a concave shape with the minimum radii achievable for the available acoustic diaphragm material in any given area. With no need to obtain stiffness by conventional means, the acoustic diaphragm assembly may be very thin, very lightweight and, when not inflated, flexible. No binding resin is used. Materials with high tensile strength, to cope with the large hoop stresses, are utilized. Very low mass is desirable to maximize acoustic efficiency and high tensile strength (high Young's modulus of elasticity) is required, to not only withstand the high tension in the acoustic diaphragm assembly, but to prevent the storage and subsequent release of energy by stretching and contracting, which would adversely affect transient and impulse performance. Air impermeability is achieved with a suitable thin film layer on the external surface of the acoustic diaphragm assembly. Sound propagating from the low frequency acoustic diaphragm of any loudspeaker results in pressure pulsations that vary from a little higher to a little lower than the prevailing ambient air pressure. Even at the threshold of pain, air pressure in the rarified trough of an acoustical waveform is significantly above absolute zero pressure. As such, the acoustic diaphragm assembly described herein will always be in a state of high tension during operation. The force imparted by the voice-coil to accelerate the acoustic diaphragm is small compared to the very high hoop stress, arising from the pressure of atmosphere, pre-tensioning it. As such, the acoustic diaphragm is minimally de-tensioned during inward excursions and so not prone to deformation during operation. A wide frequency bandwidth is thus achieved. Because the space behind the acoustic radiating diaphragm (vacuum chamber) is substantially evacuated, back-waves, that would ordinarily interact with and thus degrade the sound of the front waves, are effectively eliminated. Additionally, due to its small dimensions relative to the wavelengths of low frequency sound, the balance chamber is ineffective for storing low frequency sound energy that would otherwise re-radiate, via the tandem seal, former, and part of the acoustic diaphragm, to the detriment of sound fidelity.

As has been previously mentioned, the acoustic diaphragm does not stretch to accommodate movement of the voice-coil, but rather undergoes an increase in the radius of curvature of its concavity since the radius of curvature is already large at rest in order to not protrude too deeply into a desirably shallow enclosure. Hoop stress acting across the acoustic diaphragm will thus increase with voice-coil movement in either direction. This increase in hoop stress imposes an additional spring force acting on the acoustic diaphragm assembly which would ordinarily greatly increase its resonant frequency. But because the inner and outer fixed support surfaces of the tandem seals are curved or tapered, the resonance increase effect associated with this phenomenon is nullified. Without this feature, an extremely low resonant frequency of a lightweight acoustic diaphragm of this design in a shallow enclosure is not achievable.

A theoretically ideal acoustic diaphragm contributes nothing to sound generation beyond the compression and rarefaction of the air requested by the voice-coil acting upon it. Acoustic diaphragms, therefore, should not be easily excited internally as to produce spurious or extraneous noises that are not part of the original signal. Also, sound should not readily propagate along the acoustic diaphragm and it should, furthermore, possess high self-damping properties within its structure. The acoustic diaphragm assembly of this apparatus possesses these properties by orienting fibers in low tension transversely or crosswise to fibers in high tension and interlacing them with no binder. The fibers are thus able to move, however minutely, relative to one another. The fibers being in various states of tension and also in intimate contact with each other, extraneous excitations within the acoustic diaphragm are dissipated. The fibers in highest tension are those most oriented from the outer edge of the acoustic diaphragm assembly towards the center, proximate the former.

One shortcoming of the standard acoustic suspension woofer arrangement is the over-damping of the excursions of large area and lightweight acoustic diaphragms that are coupled with large volumes of enclosed air; limiting low frequency performance. As a loudspeaker's acoustic diaphragm assembly moves in and out, the air molecules within the enclosure are forced to move past one another. Some degree of friction at the molecular level is associated with this movement and is referred to as viscosity. The viscosity of air inside large enclosures acting on a lightweight acoustic diaphragm tends to overly oppose its movement with excess damping, mitigating low frequency output. One curious property of typical gases and vapors is that their viscosities do not appreciably change as pressure is increased, i.e., their viscosities are a function of volume, not pressure or density. The innovation described herein, with the volume of compressed gas or vapor being very small, the damping effect is correspondingly small, just as it would be with a conventional small acoustic suspension enclosure fitted with a small acoustic diaphragm. For the subject invention, excursion over-damping is eliminated, even for the movement of large area and lightweight acoustic diaphragm assemblies. Whatever damping of the acoustic diaphragm assembly excursions that might be desired for tuning is achieved by restricting, with either variable throttling devices or optimized transfer port resistances, the free movement of compressed gas or vapor through the transfer ports or, when the device is used as an acoustic attenuator, variable damping can be additionally achieved simply by placing a variable resistor (rheostat) across the electrical voice-coil terminals in lieu of an amplifier.

The motor assembly of this invention is located within the aforementioned pressurized cylinder. Beyond minimizing the overall external dimensions of the speaker assembly, this arrangement serves to facilitate the transport of heat from the voice-coil, without the need for special ventilation provisions or the use of ferrofluids. Because the gas or vapor inside the cylinder is highly compressed, its thermal conductivity is greatly increased. Furthermore, the capacity of compressed gas or vapor to absorb thermal energy per degree of temperature rise is, on a volumetric basis, also increased. The transport of heat from the voice-coil, across the magnetic gap, to adjacent parts of the thermally conductive structure is greatly enhanced. The heat is ultimately rejected via natural convection to the environment from the rear manifold plate of the assembly.

Since there are two primary chambers comprising this invention, each at pressures greatly different than atmospheric, provisions are described which ensure proper operation in the event of very small leaks. The vacuum chamber should always be maintained as close as possible to an ideal vacuum. Any air or vapor in this chamber increases the resonant frequency of the acoustic diaphragm assembly and reduces its surface tension. A detection means consists of any appropriate pressure sensor to detect a decrease of vacuum within the vacuum chamber. A very small capacity, electrically driven vacuum pump is implemented to restore the prior degree of vacuum, via a tube coupled with the vacuum chamber. When any amount of pressure within the vacuum chamber is detected, a signal from the pressure sensor starts the vacuum pump and keeps it running until a sufficient vacuum is re-established. It is then automatically turned off. This process may also be performed manually.

Pressure in the balance chamber must be sufficiently high to achieve a force balance with the force of atmosphere acting on the acoustic diaphragm assembly, but it should also be controlled to ensure that the voice-coil is properly centered within the magnetic flux gap of the motor. A very small capacity but high pressure compressor is employed to overcome small leaks in the high pressure portion of the apparatus, which cause the acoustic diaphragm assembly to drift, by injecting air into the balance chamber. The compressor is implemented as a conventional miniature, electrical, positive-displacement type having a discharge tube coupled with the volume of compressed vapor or gas whereby air may be injected. While in operation, the voice-coil will heat the compressed gas or vapor to some degree, resulting in a small pressure increase. As the former drifts out due to the pressure increase, a solid-state (i.e., Peltier) wafer cooler thermally coupled with the external surface of the manifold plate, is energized and modulated to counter this effect. While this system may be automated, it may also be manually operated by the user.

The detection means is implemented as a conventional position sensor located proximate the former to detect a shift in its position. As pressure within the balance chamber decreases (from leaks or ambient cooling), the former will drift inward from its optimum position. The position sensor will detect this shift and signal the compressor to start; increasing balance chamber pressure to re-center the voice-coil. Similarly, if the former drifts outward, the Peltier wafer cooler is energized to cool and thus depressurize and modulate the pressure of the compressed vapor or gas to maintain voice-coil centering during operation.

The first object of the invention is to achieve an infrasonic resonant frequency of a large-area, lightweight acoustic diaphragm assembly coupled with a shallow enclosure of small volume.

The second object of the invention is to achieve high operational stiffness of a large-area, ordinarily flexible, and lightweight acoustic diaphragm by inflating it, via atmospheric pressure, into a concave, semi-toroidal shape; operating in a state of tension.

The third object of the invention is to suppress spurious noise from the acoustic radiating diaphragm assembly by incorporating fibers in various states of tension, in intimate contact with each other, but not bonded together; negating the need for damping material on its reciprocating parts.

The fourth object of the invention is to suppress, by way of substantially evacuated conditions, out of phase back waves emitted by the acoustic diaphragm assembly that would otherwise interfere with the front waves by reflecting back through the acoustic diaphragm from within the enclosure.

The fifth object of the invention is to facilitate the transport of heat from the voice-coil by the enhanced thermal conductivity and heat capacity of highly compressed gas or vapor.

The sixth object of the invention is the elimination of over damping of large area, lightweight acoustic diaphragm excursions operating at very low frequencies by the action of the acoustic diaphragm on a small volume of compressed vapor or gas.

The seventh object of the invention is to achieve passive damping of the acoustic diaphragm excursions by the restriction of the flow of compressed gas or vapor moving between the pressure cylinder and balance chamber with either variable throttling devices or optimized transfer port resistances.

DESCRIPTION OF THE PREFERRED EMBODIMENTS

Figure 1:
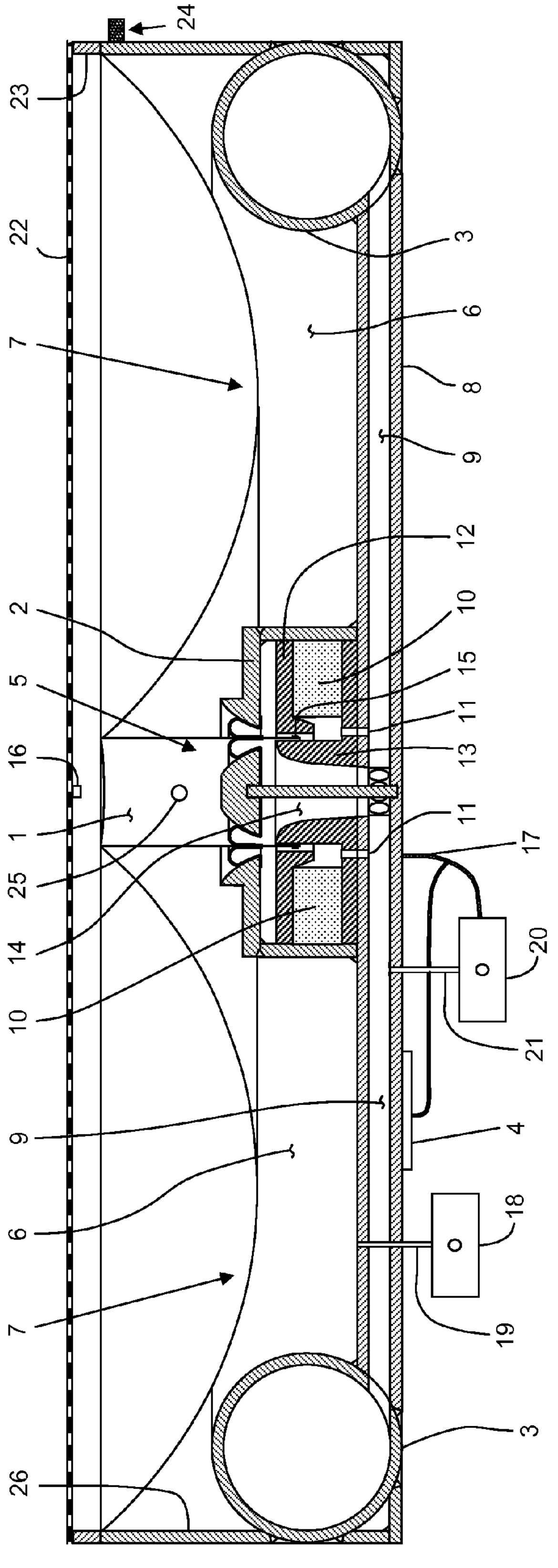
FIG. 1 shows a cutaway across the balance chamber sides

With reference to FIG. 1, the former 1 is mounted within a non-ferritic cylinder 2 which is under high pressure from the connected balance chamber 3 containing compressed gas or vapor. The high pressure is exerted against the inside surface of the flexible portion of the tandem seal assembly 5 which is comprised of gas-impermeable, durable, strong and flexible material serving as a movable pressure boundary between the compressed gas or vapor and the vacuum chamber 6. The tandem seal assembly 5 allows relative longitudinal motion between the former 1 and the cylinder 2. The former 1 is attached to and thus moves the acoustic diaphragm assembly 7 as directed by the voice-coil 15. The perimeter of the acoustic diaphragm assembly 7 may be any suitable shape, for example, a rectangle, square, triangle, circle, ellipse, etc. The preferred embodiment is described in terms of a circular acoustic diaphragm.

The former 1 is thermally conductive, very lightweight, but robust enough to withstand the high compressive force from the acoustic diaphragm assembly 7 which bears the force of atmosphere on its external surface. An aluminum, magnesium, or titanium thin-walled cylinder is appropriate for the former 1. A small hole 25 in the former 1 couples the vacuum chamber 6 with the space behind the portion of the acoustic diaphragm assembly 7 that spans across the top of the former 1. The acoustical radiating diaphragm assembly 7 is comprised of any thin, flexible, lightweight fabric with high tensile strength (aramid or carbon fiber, for example) with an air-impermeable and lightweight membrane across its external surface, not shown, to sustain the vacuum behind it. The acoustic diaphragm assembly 7 is inflated inwardly by atmospheric pressure and so is forced into a concave, semi-toroidal shape. The space between the acoustic diaphragm assembly 7 and the non-ferritic rear manifold plate 8 and bound by the balance chamber 3, excluding the cylinder 2 and tandem seal assembly 5, comprises the vacuum chamber 6. The cylinder 2 volume is pneumatically coupled with the balance chamber 3 via transfer ports 9 molded or machined within the rear manifold plate 8. The balance chamber 3 serves as a reservoir of preferred volume of compressed gas or vapor.

The diameter of the cylinder 2 is sufficiently large to house the motor assembly. The motor assembly is comprised of a magnet/magnets (preferably neodymium for high specific magnetic strength or alnico if high magnet temperatures are to be anticipated) 10, a pole-piece of magnetic steel with an integral back-plate 13 and a magnetic steel front-plate 12. The gap between the pole-piece 13 and the front-plate 12 contains a strong magnetic flux within which is suspended the voice-coil 15 which is comprised of an electrically conductive wire wrapped around the lower skirt of the former 1. Leads (not shown) from the voice-coil 15 are routed to the binding posts 24 (one of two posts are shown) for connection to an external amplifier. The pole-piece 13 is cylindrical with the bore 14 of the cylinder allowing gas or vapor to flow into and out of the balance chamber 3 via the transfer ports 9 from behind the tandem seal assembly 5 inside the cylinder 2. The motor assembly is completely sealed within the high pressure volume of the apparatus. To facilitate gas or vapor circulation during operation, ports 11 are incorporated into the back plate of the pole-piece 13. When the device is used as an acoustic attenuator, variable damping of the acoustic diaphragm assembly 7 excursions can be achieved simply by placing a variable resistor (rheostat), not shown, across the binding posts 24 in lieu of an amplifier. In this configuration movement of the acoustic diaphragm assembly 7 is induced by airborne environmental sound pressure fluctuations. Acoustic diaphragm assembly 7 motion thus results in motion of the voice-coil 15 (operating as a generator) within the magnetic gap, resulting in electrical power which dampens diaphragm assembly 5 motion. The generated electrical energy is dissipated as heat from the resistor, not shown.

The acoustic diaphragm assembly 7 is attached and sealed to the perimeter wall 26 which is supported by the balance chamber 3. Being fixed and sealed at its perimeter, the acoustic diaphragm assembly 7 has zero perimeter movement during sound production with increasing movement towards the center, proximate the former 1, where motion is at its maximum. The perimeter wall 26 on which the acoustic diaphragm assembly 7 is mounted may be any suitable shape, for example, a rectangle, square, triangle, circle, ellipse, etc. The preferred embodiment will be described in terms of a circular shaped perimeter wall 26 to support a circular shaped acoustic diaphragm assembly 7.

The compressed gas or vapor in the balance chamber 3 serves to, via the tandem seal assembly 5 acting on the former 1, offset the force of atmosphere acting on the acoustic diaphragm assembly 7. But pressure in the balance chamber 3 should be controlled to ensure that the voice-coil 15 remains centered within the magnetic flux gap of the motor in the event of small leaks. A very small capacity but high pressure compressor and integrated control module 20 is thus employed to overcome drift of the acoustic diaphragm assembly 7 by injecting outside air into the balance chamber 3 via the transfer ports 9. The compressor control module 20 incorporates a conventional electrical positive-displacement compressor having a pressurization tube 21 coupled with a transfer port 9 whereby compressed air may be entered. As pressure within the balance chamber 3 decreases (from leaks or diffusion), the former 1 will drift inward from its optimum position. The position sensor 16 detects this shift and produces a signal via cable 17 to start and run the compressor 20 long enough to increase balance chamber 3 pressure and thus re-center the voice-coil. As the former moves outward due to the pressure increase due to voice-coil 15 heating during operation, the position sensor 16 will detect this shift and produce a signal via cable 17 to energize and modulate a Peltier wafer cooler 4, which is thermally coupled with the external surface of the manifold plate 8. The position sensor 16 is mounted to a protective perforated plate 22 separated by a spacer 23 to ensure sufficient clearance with the top of the former 1 at full excursion. While the drift control system may be automated, it may also be manually operated by the user.

A hard vacuum is maintained in the vacuum chamber 3 in the event of small leaks. A leakage detection means consists of any type of pressure sensor to detect any loss of vacuum within the vacuum chamber 6. An electrically driven small capacity vacuum pump with an integral pressure sensor 18 is implemented to evacuate the vacuum chamber 6 via a vacuum tube 19 which passes through a rear manifold plate 8 and into the vacuum chamber 6. Any intersection of a vacuum tube 19 and a pressure transfer port 9 is completely sealed from each other. When any pressure (absolute) within the vacuum chamber 6 is detected, a signal from the pressure sensor starts the vacuum pump 18 and keeps it running until a sufficient vacuum is re-established at which time it is turned off.

Figure 2:
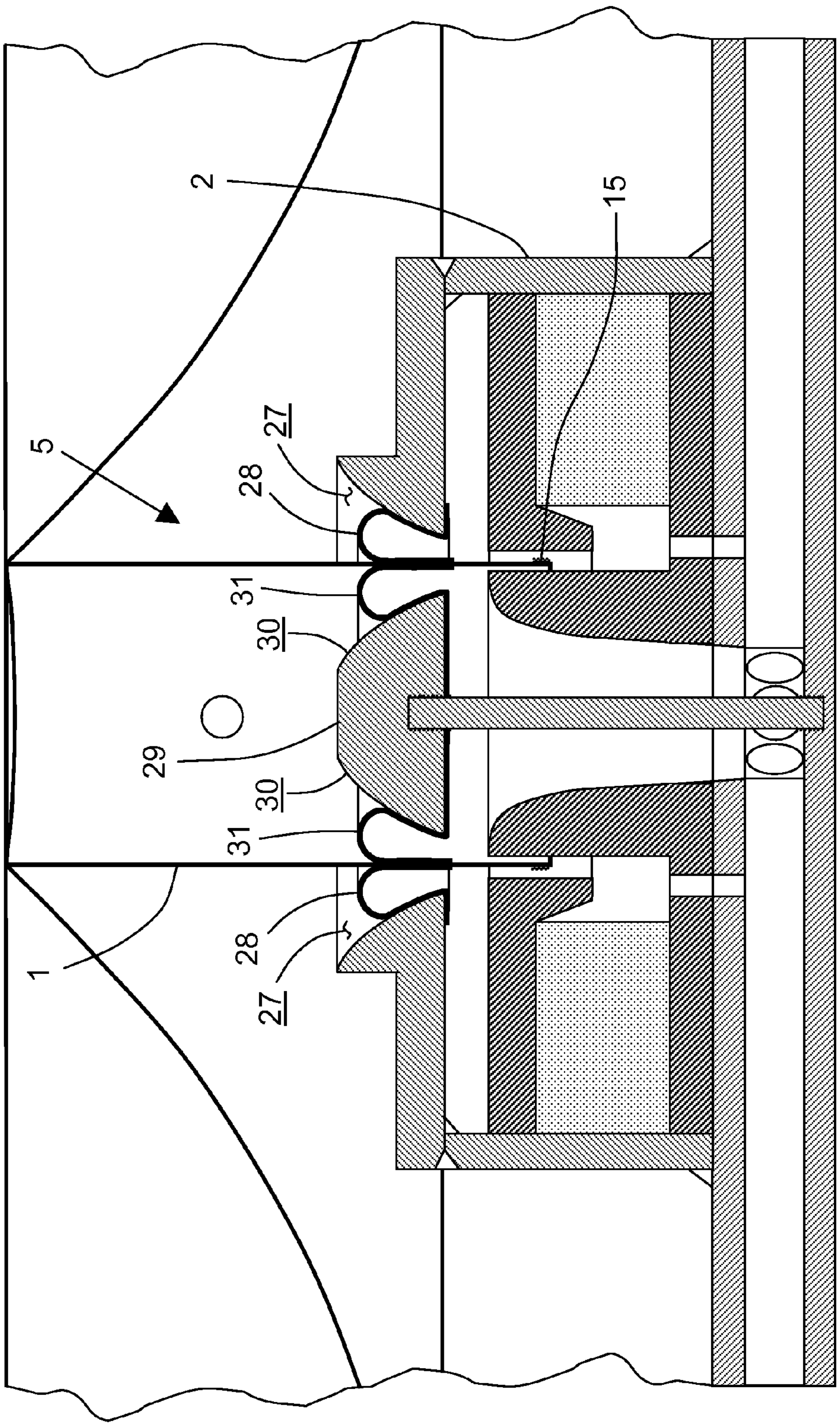
FIG. 2 shows a detail of the tandem seal assembly in balance condition

With reference to FIG. 2 the tandem seal assembly 5 is comprised of assorted elements which work together to minimize the change of pressure within the balance chamber 3 of FIG. 1 for any given excursion of the former 1. The flexible portions of the tandem seal assembly 5 are inflated by the high internal gas or vapor pressure within the cylinder 2 and serve as movable high pressure boundaries. The upper inside surface of the cylinder 2 serves as a fixed support surface 27 for the outer portion of the tandem seal 28. The upper portion of the axially mounted spool piece 29, mounted within the cylinder 2, provides a fixed support surface 30 for the inner portion of the tandem seal 31. Between these two fixed support surfaces 27, 30 and attached to the tandem seal, is the former 1. The meniscuses of the inner and outer portions of the tandem seal 31, 28 move along these fixed support surfaces 27, and along the movable former 1 as it is put in motion by the voice-coil 15. The inner and outer support surfaces 27, 30 are not parallel, but curved and/or tapered to reduce the resonant frequency of the acoustic diaphragm assembly 7 and/or to achieve other desired performance characteristics. As the meniscuses of the inner and outer portions of the tandem seal 31, 28 move along the fixed support surfaces 27, 30 their radii of curvatures change in accordance with the direction and amount of former 1 offset.

Figure 3:
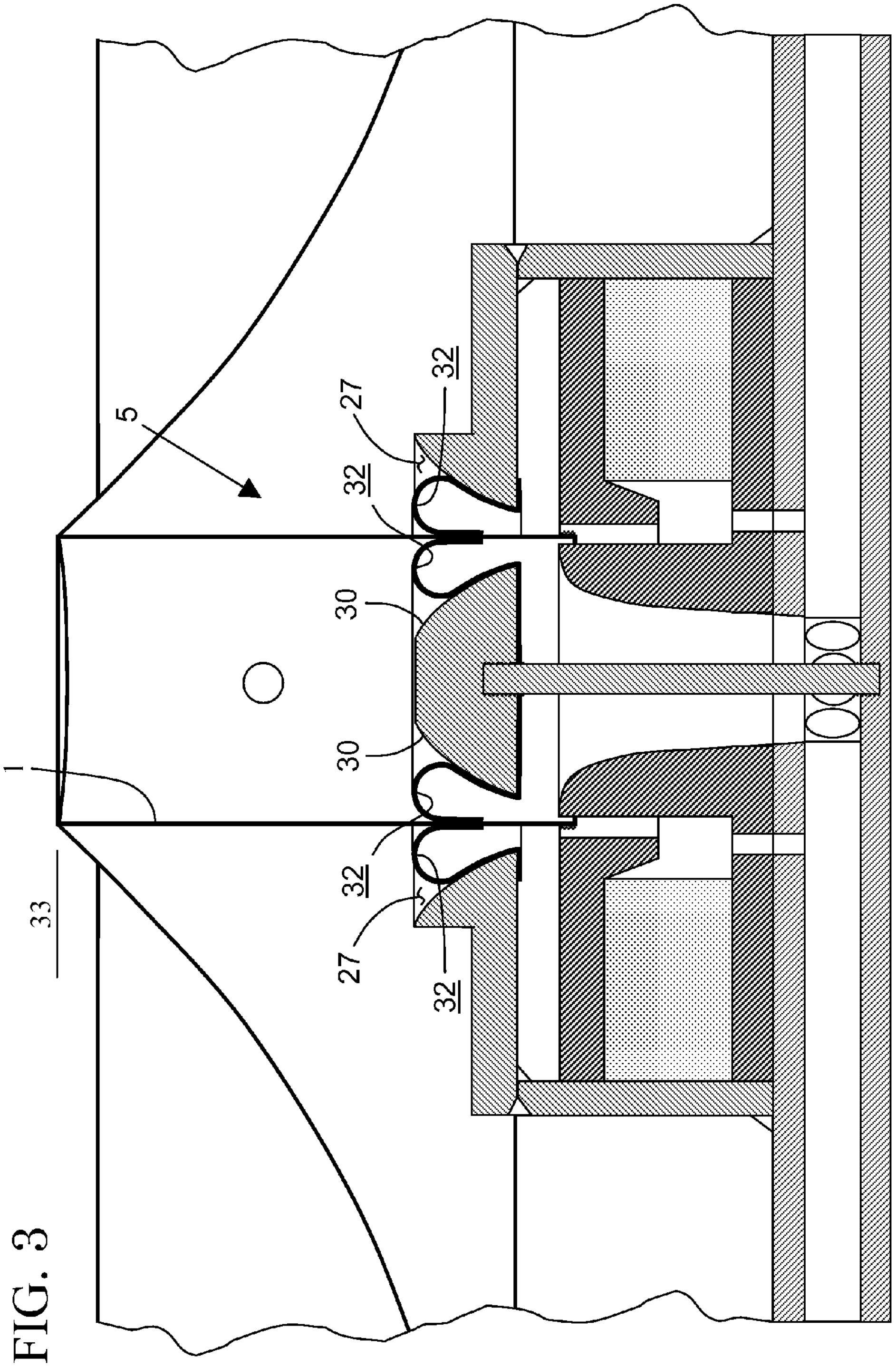
FIG. 3 shows a detail of the tandem seal assembly at its upper excursion limit

With reference to FIG. 3 the tandem seal assembly 5 is shown with the former 1 at its upper excursion limit 33. With outward (upward) movement of the tandem seal meniscuses, their radii of curvatures increase as the support surfaces 27, 30 diverge, thus increasing the working surface areas 32 of the seal assembly 5 as pressure falls. The working surface areas 32 are defined as the total surface area of the tandem seal pressure boundary not in contact with either of the support surfaces 27, 30 or the former 1 at any given moment during operation.

Figure 4:
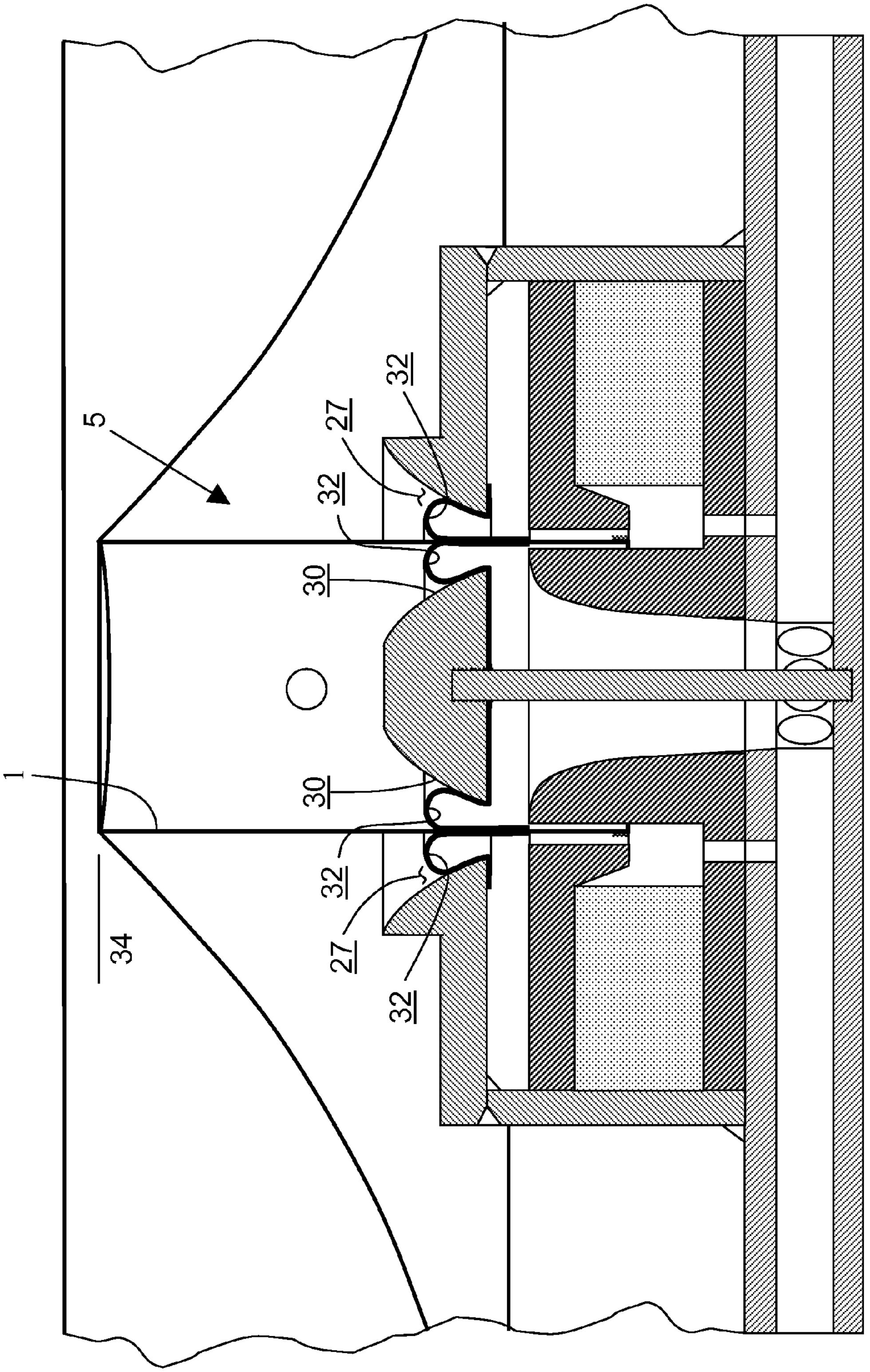
FIG. 4 shows a detail of the tandem seal assembly at its lower excursion limit

With reference to FIG. 4 the tandem seal assembly 5 is shown with the former 1 at its lower excursion limit 34. With a downward (inward) movement of the tandem seal meniscuses, their radii of curvatures diminish as the support surfaces 27, 30 converge, thus decreasing the working surface areas 32 of the seal assembly 5 as pressure increases.

Figure 5:
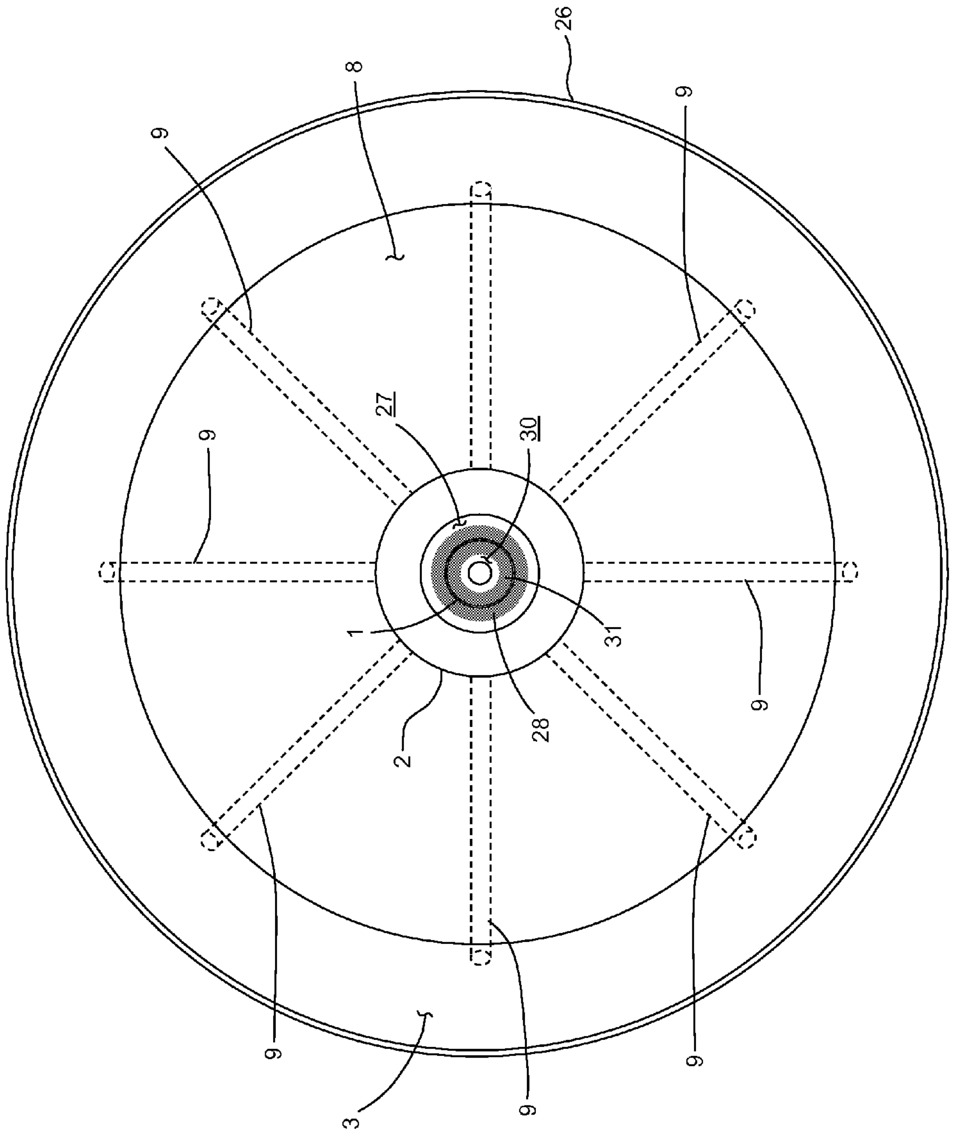
FIG. 5 shows a plan view of the balance chamber/balance ports/cylinder assembly sans acoustic diaphragm

With reference to FIG. 5, a plan view of the apparatus is shown with the acoustic diaphragm removed. The pressure transfer ports 9 are each shown within the back plate 8 pneumatically coupling the cylinder 2 to the balance chamber 3 and all being in the same plane. The former 1 is shown within the cylinder 2 between the inner and outer elements 31, 28 of the tandem seal with their corresponding inner and outer support surfaces 30, 27. The rear manifold plate 8, cylinder 2, and balance chamber 3 are fabricated from a non-ferritic, thermally conductive material which is strong and easily fabricated and welded to be leak-free. Aluminum or non-magnetic stainless steel is suitable. The perimeter wall 26 is attached to and encloses the balance chamber 3 and serves as the support element for the acoustic diaphragm 7 shown in FIG. 1. The perimeter wall 26 may be any suitable plan shape, for example, a rectangle, square, triangle, circle, ellipse, etc. The preferred embodiment is described in terms of a circular perimeter wall 26.

Figure 6:
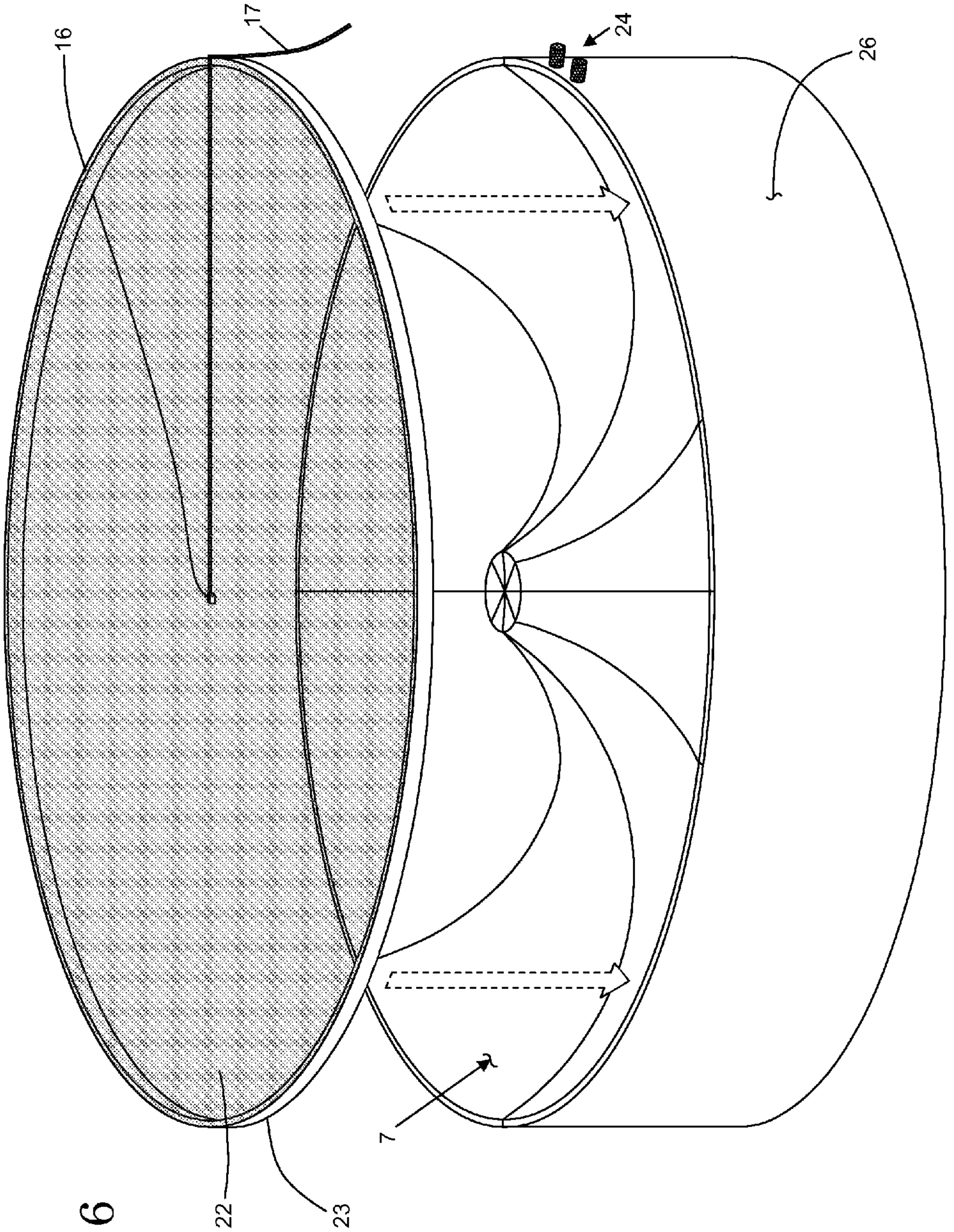
FIG. 6 shows an isometric of the complete speaker assembly

With reference to FIG. 6, the acoustic diaphragm assembly 7 is, for clarity, shown with the perforated protective plate 22, the associated spacer 23 and the attached former position sensor 16 moved away from their normal positions. The dashed-line arrows indicate the location of their normal positions. The acoustic diaphragm assembly 7, between its center and perimeter, is allowed to protrude inwardly into the vacuum space (not shown) as atmospheric pressure acts on its surface. The atmospheric pressure presses the acoustic diaphragm assembly 7 into a concave, semi-toroidal depression with the minimum radius of curvatures possible for the available fabric. Voice-coil leads (not shown) are routed within the acoustic diaphragm assembly to the binding posts 24 for connection to a driving audio amplifier or a resistor when the device is being used as an attenuator.

Figure 7:
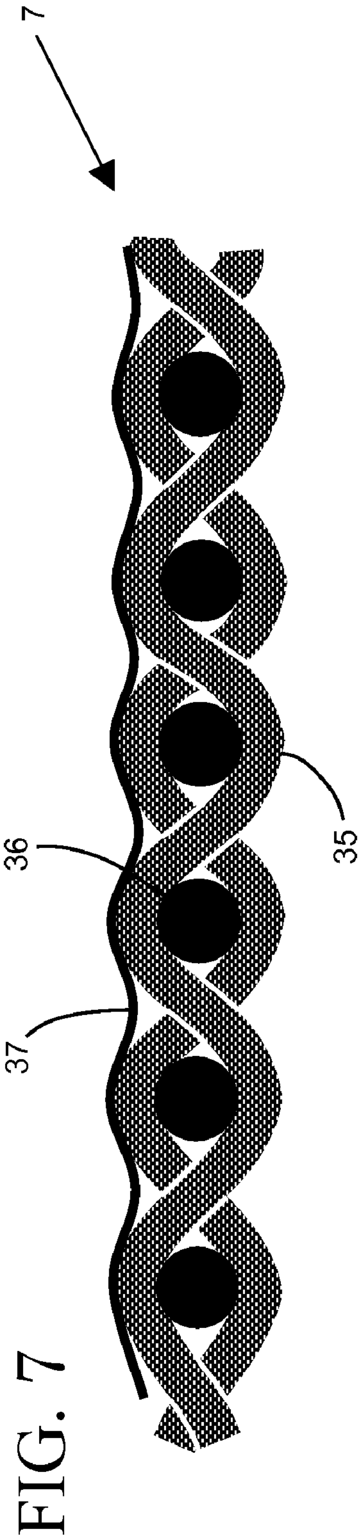
FIG. 7 shows an edgewise cutaway of the acoustic diaphragm assembly

With reference to FIG. 7, the acoustic diaphragm assembly 7 of this apparatus achieves high self damping properties by orienting fibers of low tension (shown gray) 35 transversely or crosswise to the fibers in high tension (shown black) 36 and interlacing the two with no binder. The fibers are thus able to move, however minutely, relative to one another to dissipate extraneous sound. Air impermeability is achieved with a thin film layer 37 on the external surface of the acoustic diaphragm assembly. Any thin, lightweight and gas high-barrier film, such as polyvinylidene chloride (PVCD) or ethylene vinyl alcohol (EVOH) is suitable for this purpose.

Figure 8:
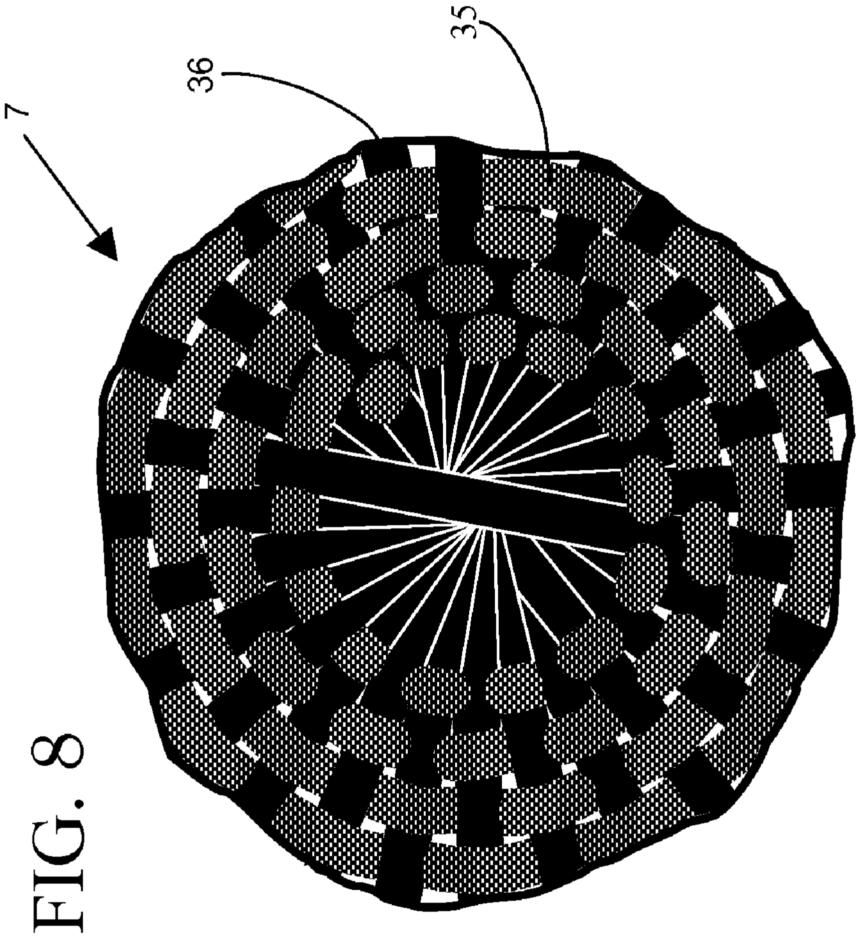
FIG. 8 shows acoustic diaphragm assembly fabric fiber orientation

With reference to FIG. 8, the fibers of the acoustic diaphragm assembly 7 of this apparatus with highest tension (shown black) 36 are those orienting from its outer edge towards the center, where the former, not shown, is located. The low tension fibers (shown gray) 35 are wound tangentially from the center outward to the perimeter of the acoustic diaphragm assembly 7.

Figure 9:
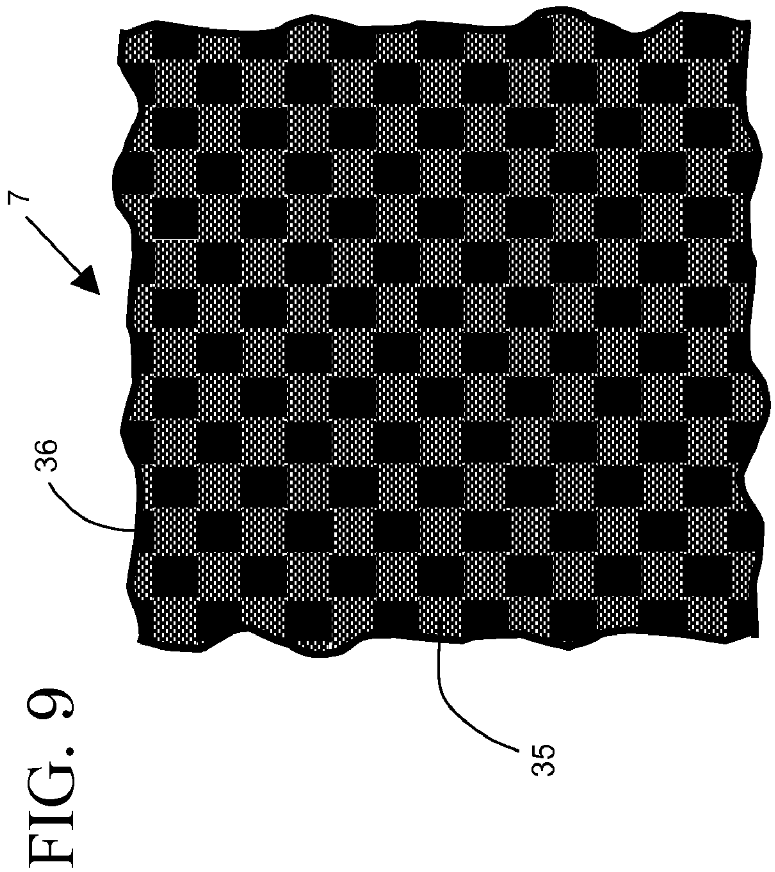
FIG. 9 shows acoustic diaphragm assembly fabric fiber orientation (another embodiment)

With reference to FIG. 9, another embodiment of the acoustic diaphragm assembly 7 is shown where, in lieu of fibers of highest tension oriented from the outer edge of the assembly towards the center and with fibers in lower tension wound tangentially from the center outward to the perimeter, fibers 35, 36 are oriented generally 90 degrees from each other and interlaced. Over a vast majority of the acoustic diaphragm assembly's 7 surface area, fibers 35, 36 experience dissimilar tensions from each other, which serve to dissipate extraneous vibrations.

Figure 10:
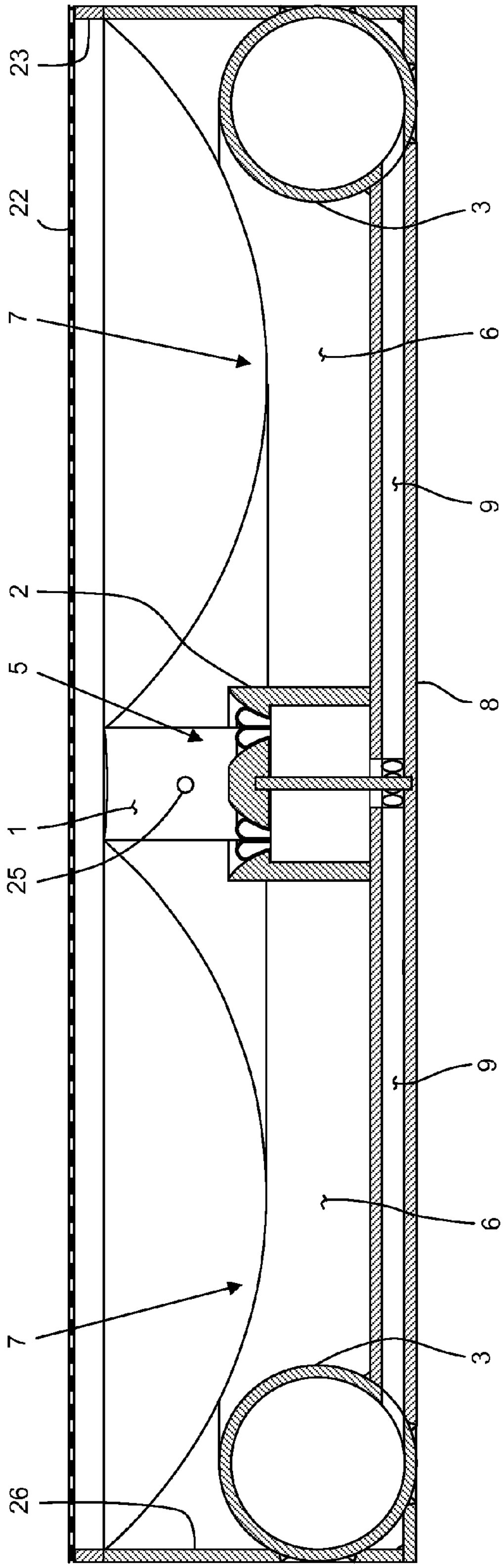
FIG. 10 shows a cutaway across the balance chamber sides (another embodiment of acoustic attenuator only)

With reference to FIG. 10, a simplified attenuator is shown where excursion damping is not via passive electro-magnetic means, but is rather achieved by optimizing transfer port 9 resistances, incorporating variable throttling devices in the transfer ports 9 or incorporating a viscous damper, not shown. As such, a means for ensuring precise voice-coil centering is not needed as none exists. Furthermore, when only short term operability is required, such as for launch vehicles, very small leakages are not a concern. As such, vacuum and pressure control systems may be omitted. Construction of the tandem seal assembly is identical to the aforementioned descriptions.

The former 1 (sans voice-coil) is mounted within a cylinder 2 which is under high pressure from the connected balance chamber 3 containing compressed gas or vapor. The high pressure is exerted against the inside surface of the flexible portion of the tandem seal assembly 5 which is comprised of gas-impermeable, durable, strong and flexible material serving as a movable pressure boundary between the compressed gas or vapor and the vacuum chamber 6. The tandem seal assembly 5 allows a relative longitudinal motion between the former 1 and the cylinder 2. The former 1 is attached to and thus moves with the acoustic diaphragm assembly 7 which is moved by airborne acoustic energy.

The former 1 is thermally conductive, very lightweight, but robust enough to withstand the high compressive force from the acoustic diaphragm assembly 7 which bears the force of atmosphere on its external surface. An aluminum, magnesium or titanium thin-walled cylinder is appropriate for the former 1. A small hole 25 in the former 1 couples the vacuum chamber 6 with the space beneath the portion of the acoustic diaphragm assembly 7 that spans across the top of the former 1. The acoustical radiating diaphragm assembly 7 is comprised of any thin, flexible, lightweight fabric with high tensile strength (aramid or carbon fiber, for example) with an air-impermeable membrane covering its external surface, not shown, to maintain a vacuum within the vacuum chamber 6. The acoustic diaphragm assembly 7 is inflated inwardly by atmospheric pressure and so is forced into a concave, semi-toroidal shape. The space between the acoustic diaphragm assembly 7 and the non-ferritic rear manifold plate 8 and bound by the balance chamber 3, excluding the cylinder 2 and tandem seal assembly 5, comprises the vacuum chamber 6. The cylinder 2 volume is pneumatically coupled with the balance chamber 3 via transfer ports 9 molded or machined within the rear manifold plate 8. The balance chamber 3 serves as a reservoir of preferred volume of compressed gas or vapor.

The acoustic diaphragm assembly 7 is attached and sealed to the perimeter wall 26 which is supported by the balance chamber 3. No enclosure, in the conventional sense, is needed for operation. Being fixed at its perimeter, the acoustic diaphragm assembly 7 has zero perimeter movement during sound production with increasing movement towards the center, proximate the former 1, where it is at its maximum.

This invention has been described in a way that is, to a reasonable extent, specific to its operational principles and physical features. This invention is subject to embodiments of varied other forms, however. The preferred embodiments of the invention are described with the understanding that the present disclosure is not intended to limit the form of the invention solely to the embodiments described. Those ordinarily skilled in the art will readily comprehend that the innovative concepts presently described can be employed such that other embodiments of the invention are feasible. The invention, therefore, is not to be limited except by the following claims.

What is claimed:

1. A loudspeaker assembly comprising:

Movable high pressure boundaries with a small total working surface area relative to a movable acoustic radiating diaphragm, sealed to, freely movable longitudinally within, and pressurized by a fixed cylinder that is pneumatically coupled with and pressurized by a pressure vessel of preferred volume containing vapor or gas at a high pressure relative to prevailing atmospheric pressure;

a vacuum chamber with substantially evacuated conditions whose pressure boundaries include the movable acoustic radiating diaphragm assembly;

the movable acoustic radiating diaphragm assembly with a majority of its internal surface area exposed to the substantially evacuated conditions and a minority of its internal surface area acting against the movable high pressure boundaries, via a mechanical couple wherein as pressure within the pressure vessel is increased by inward displacement of the movable high pressure boundaries, the total working surface area of these boundaries, on which the gas or vapor acts to impede inward movement, diminishes and as pressure within the pressure vessel is reduced by outward displacement of the movable high pressure boundaries, the total working surface area of these boundaries, on which the gas or vapor acts to facilitate outward movement, increases;

a magnetic system for actuating the acoustic diaphragm assembly via a voice-coil and associated former.

2. The sound reproducing assembly of claim 1 wherein the increasing working surface area of the movable high pressure boundaries occurs by the increasing radii of curvatures of their meniscuses as their fixed support surfaces diverge along their lengths in the outward direction of excursion.

3. The sound reproducing assembly of claim 1 wherein the decreasing working surface area of the movable high pressure boundaries occurs by the decreasing radii of curvatures of their meniscuses as their fixed support surfaces converge along their lengths in the inward direction of excursion.

4. The sound reproducing assembly of claim 1 wherein the acoustic diaphragm assembly is composed of high tensile strength but lightweight fibers of various orientations in intimate contact with each other and allowed to individually bear, according to their orientations, stress along their lengths, independent of adjacent fibers.

5. The sound reproducing assembly of claim 1 wherein the acoustic diaphragm assembly is further comprised of a thin and lightweight air impermeable external membrane held in place by atmospheric pressure.

6. The sound reproducing assembly of claim 1 wherein the means for maintaining proper gas pressure in the pressure retaining chamber comprises a position measuring device and an air pump and solid state cooler responsive to the position measuring device.

7. The sound reproducing assembly of claim 1 wherein damping of the acoustic diaphragm assembly excursions is achieved by incorporating either variable throttling devices in the flow-paths that pneumatically couple the fixed cylinder with the pressure vessel of preferred volume or by optimizing the permanent flow resistances of said flow-paths.

8. An acoustic attenuator assembly comprising:

Movable high pressure boundaries with a small total working surface area relative to a movable acoustic diaphragm, sealed to, freely movable longitudinally within, and pressurized by a fixed cylinder that is pneumatically coupled with and pressurized by a pressure vessel of preferred volume containing vapor or gas at a high pressure relative to prevailing atmospheric pressure;

a vacuum chamber with substantially evacuated conditions whose pressure boundaries include the movable acoustic diaphragm assembly;

the movable acoustic diaphragm assembly with a majority of its internal surface area exposed to the substantially evacuated conditions and a minority of its internal surface area acting against the movable high pressure boundaries, via a mechanical couple wherein as pressure within the pressure vessel is increased by inward displacement of the movable high pressure boundaries, the total working surface area of these boundaries, on which the gas or vapor acts to impede inward movement, diminishes and as pressure within the pressure vessel is reduced by outward displacement of the movable high pressure boundaries, the total working surface area of these boundaries, on which the gas or vapor acts to facilitate outward movement, increases;

a magnetic system for inducing electrical current in a voice-coil, for damping, arising from movements of the acoustic diaphragm assembly responding to environmental pressure fluctuations.

9. The acoustic attenuator assembly of claim 8 wherein the increasing working surface area of the movable high pressure boundaries occurs by the increasing radii of curvatures of their meniscuses as their fixed support surfaces diverge along their lengths in the outward direction of excursion.

10. The acoustic attenuator assembly of claim 8 wherein the decreasing working surface area of the movable high pressure boundaries occurs by the decreasing radii of curvatures of their meniscuses as their fixed support surfaces converge along their lengths in the inward direction of excursion.

11. The acoustic attenuator assembly of claim 8 wherein the acoustic diaphragm assembly is composed of high tensile strength but lightweight fibers of various orientations in intimate contact with each other and allowed to individually bear, according to their orientations, stress along their lengths, independent of adjacent fibers.

12. The acoustic attenuator assembly of claim 8 wherein the acoustic diaphragm assembly is further comprised of a thin and lightweight air impermeable external membrane held in place by atmospheric pressure.

13. The acoustic attenuator assembly of claim 8 wherein the means for maintaining proper gas pressure in the pressure retaining chamber comprises a position measuring device and an air pump and solid state cooler responsive to the position measuring device.

14. The acoustic attenuator assembly of claim 8 wherein damping of the acoustic diaphragm assembly excursions is achieved by incorporating either variable throttling devices in the flow-paths that pneumatically couple the fixed cylinder with the pressure vessel of preferred volume or by optimizing the permanent flow resistances of said flow-paths.

* * * * *